(12) United States Patent
Zhou et al.

(10) Patent No.: US 12,724,083 B2
(45) Date of Patent: Sep. 1, 2026

(54) METHOD FOR ANALYZING AND PREDICTING STATE OF HEALTH OF LITHIUM BATTERY, APPARATUS, ELECTRONIC DEVICE, AND STORAGE MEDIUM

(71) Applicant: Makesense Energy Technology Co., Limited., Shanghai (CN)

(72) Inventors: Guopeng Zhou, Shanghai (CN); Xiaohua Chen, Shanghai (CN); Pei Song, Shanghai (CN); Enhai Zhao, Shanghai (CN); Xiao Yan, Shanghai (CN)

(73) Assignee: Makesense Energy Technology Co., Limited, Shanghai (CN)

( * ) Notice: Subject to any disclaimer, the term of this patent is extended or adjusted under 35 U.S.C. 154(b) by 350 days.

(21) Appl. No.: 18/508,187

(22) Filed: Nov. 13, 2023

(65) Prior Publication Data

US 2024/0159838 A1 May 16, 2024

(30) Foreign Application Priority Data

Nov. 14, 2022 (CN) ........................ 202211431372.0

(51) Int. Cl.

| | |
|---|---|
| ***G01R 31/392*** | (2019.01) |
| ***G01R 31/367*** | (2019.01) |
| ***G01R 31/3842*** | (2019.01) |

(52) U.S. Cl.
CPC ......... *G01R 31/392* (2019.01); *G01R 31/367* (2019.01); *G01R 31/3842* (2019.01)

(58) Field of Classification Search
CPC ................ G01R 31/392; G01R 31/367; G01R 31/3842; Y02E 60/10
See application file for complete search history.

(56) References Cited

U.S. PATENT DOCUMENTS

| | | | | |
|---|---|---|---|---|
| 10,459,034 | B2 * | 10/2019 | Basu | G01R 31/367 |
| 2018/0261893 | A1 * | 9/2018 | Fujita | G01R 31/392 |
| 2021/0141028 | A1 * | 5/2021 | Du | G01R 31/392 |

* cited by examiner

*Primary Examiner* — Tung S Lau
(74) *Attorney, Agent, or Firm* — IPRTOP LLC

(57) ABSTRACT

Method for analyzing and predicting state of health of a lithium battery includes: collecting battery data within a predetermined time interval, where the battery data comprises at least battery operating time, current, and voltage; determining a target area based on the battery data; establishing a relationship between a cumulative capacity of the target area and the state of health of the battery; correlating the number of cycles in the current state of the battery with the state of health of the battery using the cumulative capacity of the target area and determining a relationship between the number of cycles and the state of health of the battery; and predicting the state of health of the battery in the future according to the relationship between the number of cycles and the state of health of the battery. The method is simple and easy to operate, and practical as well.

9 Claims, 11 Drawing Sheets

METHOD FOR ANALYZING AND PREDICTING STATE OF HEALTH OF LITHIUM BATTERY, APPARATUS, ELECTRONIC DEVICE, AND STORAGE MEDIUM

FIELD OF THE INVENTION

The present invention relates to the technical field of lithium battery analysis, particularly to a method for analyzing and predicting state of health of lithium batteries, apparatus, electronic device, and storage medium.

BACKGROUND OF THE INVENTION

In recent years, with more attention paid to the new energy field, lithium batteries have become the preferred energy source for new energy vehicles and energy storage power plants due to their high energy density and long cycle life. However, with the long-term use of lithium batteries, problems such as the life and capacity degradation of lithium batteries have seriously restrict the performance of lithium batteries.

Therefore, accurately calculating the state of health (SOH) of lithium batteries and predicting the future trend of SOH changes play an important role in extending battery life and improving battery performance.

Currently, most of the existing methods for analyzing the available life of lithium batteries require special equipment for testing, and a complete full-charge or full-discharge activity for lithium batteries in order to accurately analyze the SOH of the batteries. However, these methods can only analyze the available life of the batteries under the current cycle, but cannot realize the prediction of the available life of the batteries later. In addition, when the SOH of the battery is low (e.g., close to 80%), fully charging or fully discharging the lithium batteries to test the SOH will exacerbate the battery's capacity degradation and shorten the battery's service life, thus resulting in a significant reduction in the available life of the battery in practical applications.

SUMMARY OF THE INVENTION

The present invention provides a method for analyzing and predicting state of health of lithium battery, apparatus, electronic device, and storage medium, which realize the prediction of the available life of the battery simply and reliably.

In a first aspect of the present invention, a method for analyzing and predicting state of health of lithium battery is provided, the method includes collecting battery data in accordance with a predetermined time interval, where the battery data comprises at least battery operating time, current, and voltage; determining a target area based on the battery data; establishing a relationship between a cumulative capacity of the target area and the state of health of the battery; correlating the number of cycles in the current state of the battery with the state of health of the battery using the cumulative capacity of the target area, to determine a relationship between the number of cycles and the state of health of the battery; predicting the state of health of the battery in the future according to the relationship between the number of cycles and the state of health of the battery.

In the present invention, the degradation and the available remaining life of the battery in real application scenarios can be analyzed and predicted in a simple and reliable manner.

In an embodiment of the first aspect, the determining of the target area based on the battery data includes: calculating a capacity difference according to a relationship between the battery's voltage and capacity, and fitting the voltage and the capacity difference; determining the target area and the cumulative capacity of the target area based on the relationship between the voltage and the capacity difference.

In this embodiment, a method for calculating and predicting state of health of the battery based on the cumulative capacity of the target area is proposed, and a correspondence among the number of battery cycles, the cumulative capacity of the target area, and the state of health is realized.

In an embodiment of the first aspect, the battery data further comprises the state of battery charge, the capacity is determined based on the state of battery charge, and the capacity is obtained by calculating a capacity change in a charging and discharging process according to the collected battery current and battery operating time.

In an embodiment of the first aspect, the determining of the target area includes: determining the target area based on a particular charging or discharging cycle activity of the battery; wherein the target area is a region containing a significant change in capacity difference, a starting point of the target area is a difference abrupt change point or a difference maximum point of a capacity difference curve, and an ending point of the target area is a maximum point of the capacity difference curve.

In an embodiment of the first aspect, the determining of the cumulative capacity of the target area includes: calculating a sum of the capacity difference from a starting point to an end point of the target area.

In an embodiment of the first aspect, a method for determining the number of cycles includes: taking the current cycle as a base cycle and adding the subsequent cycles one by one, so that the subsequent number of cycles is an overall translation of the current number of cycles; correcting the number of cycles by utilizing the capacity obtained from the last calibration experiment as an actual full charge capacity of the battery for a subsequent period of time as well as an applied capacity of each cycle of the battery during actual application to respond to the fact that the battery is not fully charged and discharged when it is actually applied.

In an embodiment of the first aspect, the battery data further includes charging data and/or discharging data; and the method further includes at least one of the following: predicting the number of cycles that can be performed by the battery when the state of health of the battery reaches a predetermined percentage based on a first relationship between the number of cycles and the state of health of the battery; fitting the cumulative capacity of the target area and the state of health of the battery based on the charging data in a preset number of cycles, and predicting the state of health of the battery in the future based on a second relationship between the number of cycles and the state of health of the battery; re-predicting the state of health of the battery in the future and updating an original prediction result based on new battery data acquired after a predetermined period of time; replacing the target area at a specific cycle number herein the target area is the range between a difference abrupt change point and a difference maximum point of the capacity difference curve; predicting the state of health of the battery in the future by combining the charging data and the discharging data, and correcting prediction results corresponding to the charging data and the discharging data.

In this embodiment, a full-charge and full-discharge calibration experiment is carried out on the battery at regular intervals, which provides data for the present invention, therefore, no additional test work is needed, and the analysis target of SOH can be realized.

In a second aspect of the present invention, an apparatus for analyzing and predicting state of health of lithium battery is provided, where the apparatus includes a data acquisition module, configured to collect battery data in accordance with a predetermined time interval, wherein the battery data comprises at least battery operating time, battery's current, and voltage; a target area determination module, configured to determine a target area based on the battery data; a first relationship determination module, configured to establish a relationship between a cumulative capacity of the target area and the state of health of the battery; a second relationship determination module, configured to correlate the number of cycles in the current state of the battery with the state of health of the battery using the cumulative capacity of the target area, to determine a relationship between the number of cycles and the state of health of the battery; a state of health prediction module, configured to predict the state of health of the battery in the future according to the relationship between the number of cycles and the state of health.

In a third aspect of the present invention, an electronic device is provided, where the electronic device includes a processor and a memory, the memory is configured to store a computer program, and the processor is configured to execute the computer program stored in the memory to enable the electronic device to perform the method described above.

In a fourth aspect of the present invention, a computer-readable storage medium is provided, where the computer-readable storage medium has a computer program stored thereon, and the computer program, when executed by a processor, implements the method described above.

The method for analyzing and predicting state of health of lithium battery, apparatus, electronic device, and storage medium in the present invention has the following benefits.

(1) The method and apparatus for calculating and predicting SOH based on the cumulative capacity of the target area is proposed for the first time, and the relationship between the number of battery cycles and the SOH and the relationship between the cumulative capacity of the target area and the SOH are established.

(2) Compared with other existing methods, the present invention is simple and easy to operate, basically does not need additional test conditions and equipment, and can be realized by the sampling data periodically obtained from the battery. Specifically, the data collected by battery management system (BMS) currently available on the market can be used for the analysis method of the present invention, therefore, no additional effort is needed. At present, the BMS on the market performs full-charge and full-discharge calibration experiments on the battery periodically to correct the state of charge (SOC) of the lithium battery, which provides data for the scheme of the present invention, so that there is no need for the present invention to perform additional test work to realize the analysis target of SOH.

(3) The present invention is highly applicable. Compared to other proposed methods, the present invention does not require experiments that will damage the battery to realize the prediction of SOH. Specifically, when the battery has been used for a long period of time, such as SOH decreases to nearly 80%, no full-discharge/full-discharge test of the battery is needed at that time, and an accurate prediction can be realized based on the fitting results of data from the previous cycles of the battery.

(4) The target area of the present invention is a region that a battery necessarily undergoes in normal charging and discharging activities, i.e., far away from the full-discharging section and the full-charging section, so that even if the battery is not fully charged or discharged, the method provided by the present invention can be applied accurately, thereby increasing the application scenario and scope of the present invention.

(5) The method in the present invention is highly reliable and stable. Even if the embodiment uses different target areas or different historical data, the error between the predicted SOH and the number of cycles is very small, and the prediction results are not drastically deviated due to the change of the selected target area.

REFERENCE NUMERALS

Figure 1:
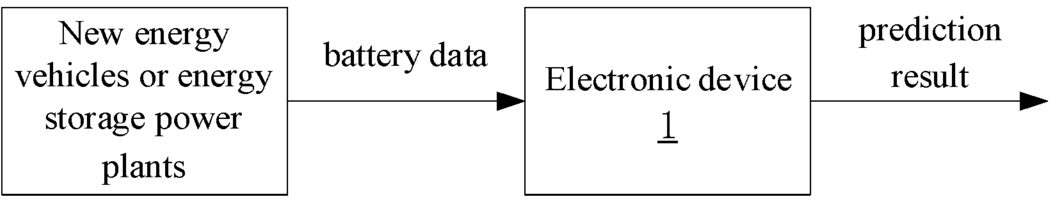
FIG. 1 shows a schematic block diagram of a method for analyzing and predicting SOH of a lithium battery according to an embodiment of the present invention.

1 Electronic device
11 Processor
12 Memory
13 Communication interface
14 System bus
10 Apparatus for analyzing and predicting state of health of lithium battery
101 Data acquisition module
102 Target area determination module
103 First relationship determination module
104 Second relationship determination module
105 State of health prediction module
S21~S25 Steps of the method flowchart

DETAILED DESCRIPTION OF THE INVENTION

The following specific embodiments illustrate the implementation of the present invention, and those skilled in the art can easily understand other advantages and effects of the present invention from the contents disclosed in this specification. The present invention may also be implemented or applied through other different specific implementation modes. Various modifications or changes may be made to all details in the specification based on different points of view and applications without departing from the spirit of the present invention. It should be noted that the following embodiments and the features in the embodiments may be combined without conflict.

It needs to be stated that the drawings provided in the following embodiments are just used for schematically describing the basic concept of the present invention, thus only illustrating components related to the present invention and are not drawn according to the numbers, shapes, and sizes of components in actual implementation, the configuration, number, and scale of each component in the actual implementation thereof may be freely changed, and the component layout configuration thereof may be more complicated.

The following embodiments of the present invention provide a method for analyzing and predicting state of health of lithium battery, apparatus, electronic device, and storage medium, including, but not limited to, being applied to an electronic device comprising of a processor and a memory. A hardware execution body for performing the method for analyzing and predicting state of health of lithium battery will be described below as an example.

As shown in FIG. 1, this embodiment provides a process of a hardware execution body for realizing the method for analyzing and predicting state of health of lithium battery, specifically including: transmitting battery data from a battery management system (BMS) in a new energy vehicle or an energy storage power plant to an electronic device 1, where the electronic device 1 executes the method for analyzing and predicting state of health of lithium battery, and outputs the prediction results. The electronic device 1 may be a control execution device inside the new energy vehicle or the energy storage power plant, or an execution device outside the new energy vehicle or the energy storage power plant. The battery data is transmitted to the electronic device via wired or wireless communication.

The technical solutions in the embodiments of the present invention will be described in detail below with reference to the accompanying drawings in the embodiments of the present invention.

Figure 2:
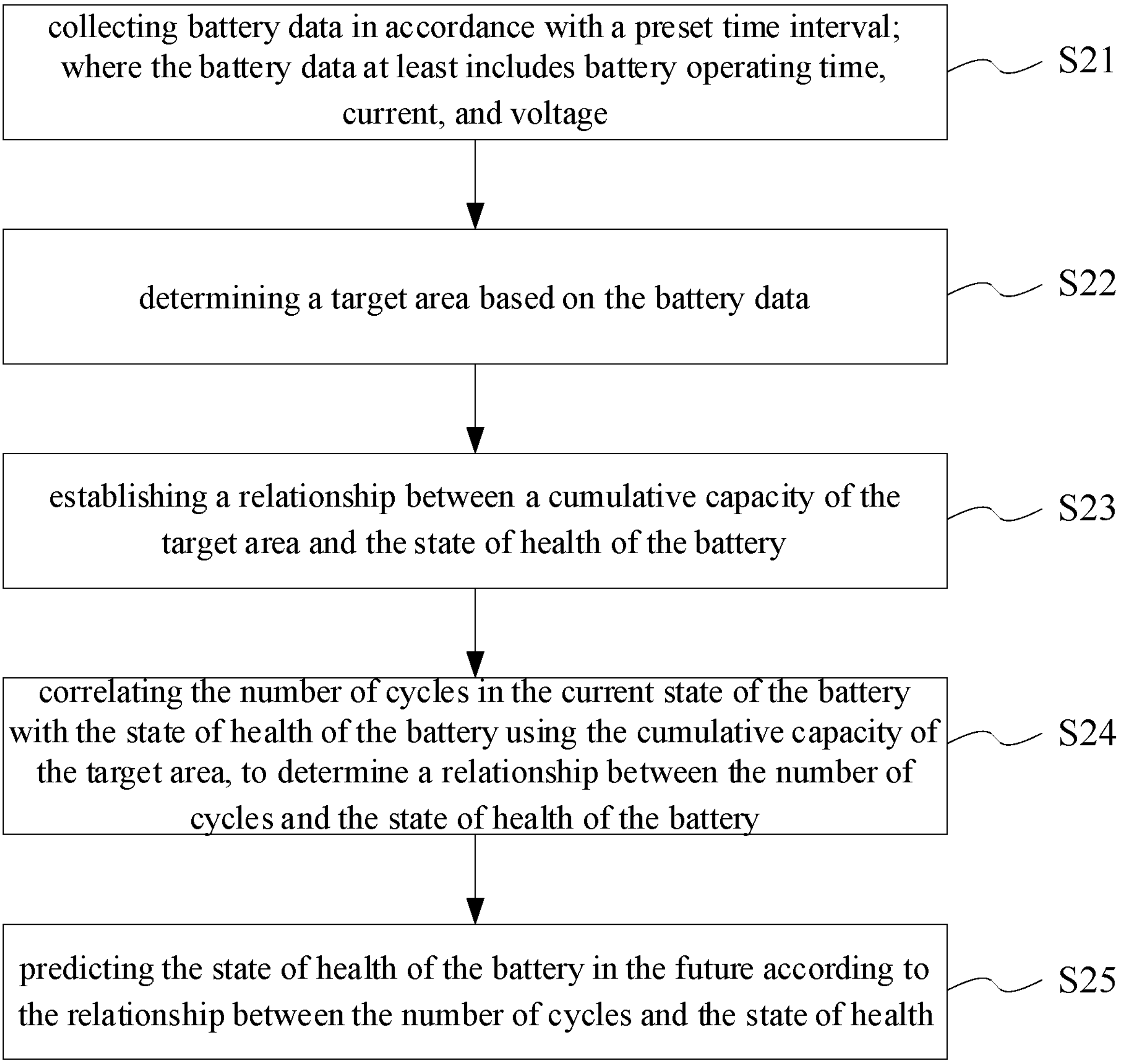
FIG. 2 shows a flowchart of the method for analyzing and predicting SOH of a lithium battery according to an embodiment of the present invention.

FIG. 2 provides the flowchart of the method for analyzing and predicting the state of health of a lithium battery, specifically the flowchart includes the following steps:

S21, collecting battery data in accordance within a preset time interval; where the battery data at least includes the operating time, current, and voltage of the battery.

Specifically, the battery data may come from an electric vehicle or a power plant, the battery data is collected at regular intervals, and the collected data mainly includes operating time, current, and voltage of the battery. In different examples, state of charge (SOC) and temperature can also be collected according to the required data needs.

S22, determining a target area based on the battery data.

In an embodiment, step S22 includes:

(1) calculating a capacity difference curve according to a corresponding relationship between the voltage and the capacity, and fitting the voltage and the capacity difference with a model.

In an embodiment, the battery data further comprises a state of charge. The capacity may be determined according to the collected state of charge or by calculating a capacity change in a charging and discharging process based on the collected current and the battery operating time.

Specifically, in an embodiment, the capacity (value) $Q_k$ is obtained by collection. In another embodiment, the capacity (value) $Q_k$ is obtained by calculating the capacity change in the charging and discharging process using the ampere-hour integral method or Kalman filter method based on the collected current and the battery operating time.

The voltage of the battery collected at the pal sampling is denoted as $V_p$, and the cumulative capacity at the pal sampling is denoted as $Q_p$, the U-Q relationship between the $V_p$ and $Q_p$ using the amper-hour integral method is shown in the following equation:

$$Q_P = \sum_{k=2}^{p} \frac{i_k + i_{k-1}}{2} \times \Delta t_k$$

where $Q_p$ is the cumulative charging or discharging capacity from the beginning of the charging and discharging activity to the $p_{th}$ sampling, $i_k$ is the current value of the $k_{th}$ sampling, $\Delta t_k$ is the time interval between the $k_{th}$ sampling and the $k-1_{th}$ sampling, and k is not greater than p.

After determining the relationship between the voltage and the capacity, a minimum voltage variation unit u is selected according to the sampling data. In different embodiments, the minimum voltage variation unit u is different and may be determined based on the sampling time interval or the number of data. In an embodiment, the minimum voltage variation unit u may be 1 mV. In another embodiment, the minimum voltage variation unit u may be 5 mV, 3 mV, 6 mV, or any number that meets the design requirements. Equations for calculating the capacity difference $Q_{diff}^k$ based on every minimum voltage variation unit u are as follows:

$$Q_{diff}^k = Q_k^u - Q_{k-1}^u$$

$$Q_{diff}^k = Q_k - Q_{k-1}$$

where $Q_{diff}^k$ is the capacity difference corresponding to the $k_{th}$ voltage change based on the minimum voltage variation unit u, and $Q_k^u$ is the cumulative capacity at the $k_{th}$ sampling (when k is 1, then the $Q_k^u$ is the cumulative capacity at the first sampling), which corresponds to the $Q_p$ above, based on the minimum voltage variation unit u.

(2) Determining the target area and the cumulative capacity of the target area based on the relationship between the voltage and the capacity difference.

In an embodiment, the determining of the target area includes determining the target area based on a particular charging or discharging cycle activity of the battery, where the target area is a region containing a significant change in capacity differential, a starting point of the target area is a difference abrupt change point or a difference maximum point of a capacity difference curve, and an ending point of the target area is a maximum point of the capacity difference curve.

It should be noted that, in the relationship between voltage and capacity difference, if the capacity difference $Q_{diff}$ at a certain point is not significantly different from the average capacity difference value of a certain section before that point, and at the same time, the average capacity difference value of a certain section after that point is significantly larger than the capacity difference of that point, then that point is called a capacity difference abrupt change point.

In the relationship between voltage and capacity difference, if the capacity difference $Q_{diff}$ at a certain point is significantly larger than the average capacity difference value of a certain section before that point, and the average capacity difference value of a certain section after that point is significantly smaller than the capacity difference of that point, then that point is called a capacity difference maximum point.

Specifically, after calculating the capacity difference, the capacity difference abrupt change point $P_i'$ (if there are a plurality of abrupt change points, they are respectively denoted in order as $P_1'$, $P_2'$, . . . , $P_n'$) and the capacity difference maximum point $M_i'$ (if there is a plurality of maximum points, they are respectively denoted in order as $M_1'$, $M_2'$, . . . , $M_n'$) can be determined, and the target area can be selected according to any one of the following criteria: 1) a region between every two adjacent $P_i'$ point and $M_i'$ point (e.g., $P_1'$~$M_1'$); 2) a region between non-adjacent $P_i'$ point and $M_i'$ point (e.g. $P_1'$~$M_2'$); 3) a region between every two adjacent $M_i'$ points (e.g. $M_1'$~$M_2'$); 4) a region between every two non-adjacent $M_i'$ points (e.g., $M_1'$~$M_3'$). In an embodiment, after the target area is determined, it will not change in the subsequent SOH analysis and prediction.

In an embodiment, the determining of the cumulative capacity of the target area includes:

calculating the sum of the capacity differences from the starting point to the end point of the target area, where the sum of the capacity differences is denoted as $\Sigma Q_{diff}$ and represents the cumulative capacity of the target area, i.e., the incremental value of the capacity from the starting point to the end point.

S23, establishing a relationship between the cumulative capacity of the target area and the state of health (SOH) of the battery.

Specifically, after a certain period of usage, such as every 100 or 200 cycles, or every 15 days, a calibration experiment is performed on the battery during a particular cycle, that is, in actual scenarios, to calibrate the state of charge (SOC) of battery management system (BMS), a full charge and discharge calibration experiment is conducted on the battery periodically, therefore, the present invention does not require additional testing work. The battery in its current state (i.e., during a particular cycle) is subjected to constant current and constant voltage discharging until fully discharged, and then constant current and constant voltage charging until fully charged, or reversed when the battery is subjected to constant current and constant voltage charging until fully charged, and then constant current and constant voltage discharging until fully discharged, as the calibration experiment conditions are the same for different cycles. The accumulated capacity at the end of charging or discharging is used as the actual available capacity $Q_{real}$ for the current cycle. The ratio of this accumulated capacity to the rated capacity $Q_{rated}$ of the battery is then SOH, i.e., $$SOH = \frac{Q_{real}}{Q_{rated}}.$$

The relationship between the cumulative capacity of the target area and SOH of the battery is established, and SOH of the battery can be predicted based on the cumulative capacity value of the target area by using this relationship. The fitting equation is:

$$SOH = \sum_{n=1}^{n_{max}} m_n \times \left(\sum Q_{diff}\right)^n + m_0,$$

where n is the order of the polynomial series, $m_n$ is the coefficient of the $n_{th}$ order of the polynomial series, $m_0$ is the fitted intercept, and $n_{max}$ is the highest order of the polynomial series.

S24, correlating the number of cycles in the current state of the battery with the state of health of the battery using the cumulative capacity of the target area, to determine a relationship between the number of cycles and the state of health of the battery.

Specifically, If the number of cycles (cycle) in the current state of the battery is known (or the number of cycles in the current state is unknown, but the relationship between the number of cycles and the SOH needs to be determined, then the cycle in the current state is set as the base cycle (such as the first cycle), and the subsequent cycles are added up one by one), the data of the battery under different charge and discharge cycles is used for determining the target area and calculating the cumulative capacity of the battery of the target area during different cycles. The number of battery cycles (cycle) and $\Sigma Q_{diff}$ are fitted to establish the relationship between the number of cycles and the cumulative capacity of the target area, and the cumulative capacity value of the target area of the battery during a specific cycle in the future can be predicted using this relationship. The fitting equation is as follows:

$$\sum Q_{diff} = \sum_{n=1}^{n_{max}} m_n \times \text{cycle}^n + m_0,$$

where n is the order of the polynomial series, $m_n$ is the coefficient of the $n_{th}$ order of the polynomial series, $m_0$ is the fitted intercept, and $n_{max}$ is the highest order of the polynomial series. Furthermore, according to the equations $$SOH = \sum_{n=1}^{n_{max}} m_n \times \left(\sum Q_{diff}\right)^n + m_0 \text{ and}$$

-continued $$\sum Q_{diff} = \sum_{n=1}^{n_{max}} m_n \times \text{cycle}^n + m_0,$$

the relationship between the number of battery cycles (cycle) and the SOH can be established. This relationship can be used to predict the SOH of the battery in a specific cycle in the future, and it can also predict how many charging and discharging cycles the battery can perform when the SOH reaches 80%.

S25, predicting the state of health of the battery in the future according to the relationship between the number of cycles and the state of health.

Specifically, the SOH of the battery in a specific cycle in the future and how many charge and discharge cycles the battery can perform when the SOH reaches 80% can be predicted based on the relationship between the number of battery cycles (cycle) and the SOH.

In an embodiment, the determination of the number of cycles includes:

taking the current cycle as the base cycle and adding the subsequent cycles one by one to the cycles. Therefore, the determined number of cycles is an overall translation of the current number of cycles.

In response to the situation that the battery is not fully charged and discharged when it is actually applied, the number of cycles is corrected by utilizing the capacity obtained from the last calibration experiment as the actual full charge capacity of the battery for a subsequent period of time as well as the applied capacity of each cycle of the battery during actual application.

Specifically, the battery is not fully charged and discharged when it is actually applied, and the number of cycles that the battery can perform when the SOH reaches 80% is corrected according to the following equation to obtain the actual number of cycles performed by the battery in the current state, i.e., $$\text{cycle}_{used} = \frac{Q_{used}}{Q_{real}},$$

where $Q_{real}$, which is the capacity obtained from the last calibration experiment, is used as the actual full charge capacity of the battery for a subsequent period of time, $Q_{used}$ is the applied capacity of the current cycle of the battery during an actual application, and $\text{cycle}_{used}$ is no greater than 1.

The discharge process of the current cycle also can be operated accordingly, so that the number of cycles can be corrected to obtain an accurate relationship between the number of cycles and the cumulative capacity of the target area.

In an embodiment, the battery data further includes charging data and/or discharge data. The method further includes at least one of the following steps (1)~(5).

(1) Predicting the number of cycles that can be performed by the battery when the SOH of the battery reaches a predetermined percentage based on a first relationship between the number of cycles and the SOH of the battery.

(2) Fitting the cumulative capacity of the target area and the SOH of the battery based on the charging data in the preset number of cycles, and predicting the SOH of the battery in the future based on a second relationship between the number of cycles that the battery can perform when the SOH reaches 80% and the SOH of the battery.

(3) Re-predicting the SOH of the battery in the future and updating the original prediction result based on new battery data acquired after a predetermined period of time.

(4) Replacing the defined target area at a specific cycle number based on a differential abrupt change point and a differential maximum point of the capacity difference curve.

Specifically, the replacement of the target area is performed according to the definition of the target area, e.g. a region between the differential abrupt change point and the differential maximum point adjacent to each other on the capacity difference curve of the 100th cycle is selected as the target area.

(5) Predicting the SOH of the battery in the future by combining the charging data and the discharging data, and correcting prediction results corresponding to the charging data and the discharging data.

Furthermore, in combination with (4) and (5), as the subsequent charging and discharging process of the battery continues, the target area may be updated according to the determination method of the target area. The SOH of the battery may be predicted and updated based on the newly updated target area, the charging data or the discharging data, and the charging data or the discharging data of the previous cycles.

Referring to FIGS. 3 to 9, in a specific embodiment of the present invention, a ternary power battery (i.e., lithium-ion battery) is provided as an example, where the SOH of the lithium battery is analyzed and predicted according to the charging data of the lithium battery by using the method described in the present invention.

(1) Data acquisition: collecting and uploading power battery data according to the present time interval, where the collected data mainly includes time, current, voltage, SOC, temperature, etc. Due to that the temperature change during the verification process of the present invention is very small and the temperature is nearly constant, the influence of temperature can be ignored.

(2) Establishing the relationship between voltage and capacity and the relationship between voltage and capacity difference.

(2.1) Establishing the corresponding relationship between voltage and capacity. Based on the collected capacity data, the correspondence between voltage and capacity, i.e., U-Q, can be determined. In another embodiment, the capacity values are not directly collected, and the ampere-hour integral method (or Kalman filter method) is utilized to calculate the capacity $Q_k$ during the charging process. The U-Q relationship is established based on $V_p$ and $Q_p$, where $V_p$ represents the voltage of the battery at the $p_{th}$ sampling, and $Q_p$ represents the cumulative capacity at the $p_{th}$ sampling.

(2.2) Establishing the relationship between voltage and capacity difference. After determining the relationship between voltage and capacity, the minimum voltage variation unit u for the sampled data is selected. In this embodiment, u=1 mV, i.e., the capacity difference $Q_{diff}^k$ is calculated for every 1 mV change in voltage. After calculating the capacity difference, the voltage-capacity difference relationship $U-Q_{diff}^k$ can be determined, and the capacity difference abrupt change point $P_i'$ (if there are a plurality of abrupt change points, they are respectively denoted in order as $P_1'$, $P_2'$, . . . , $P_n'$) and the capacity difference maximum point $M_i'$ (if there is a plurality of maximum points, they are respectively denoted in order as $M_1'$, $M_2'$, . . . $M_n'$) can also be determined.

Figure 3:
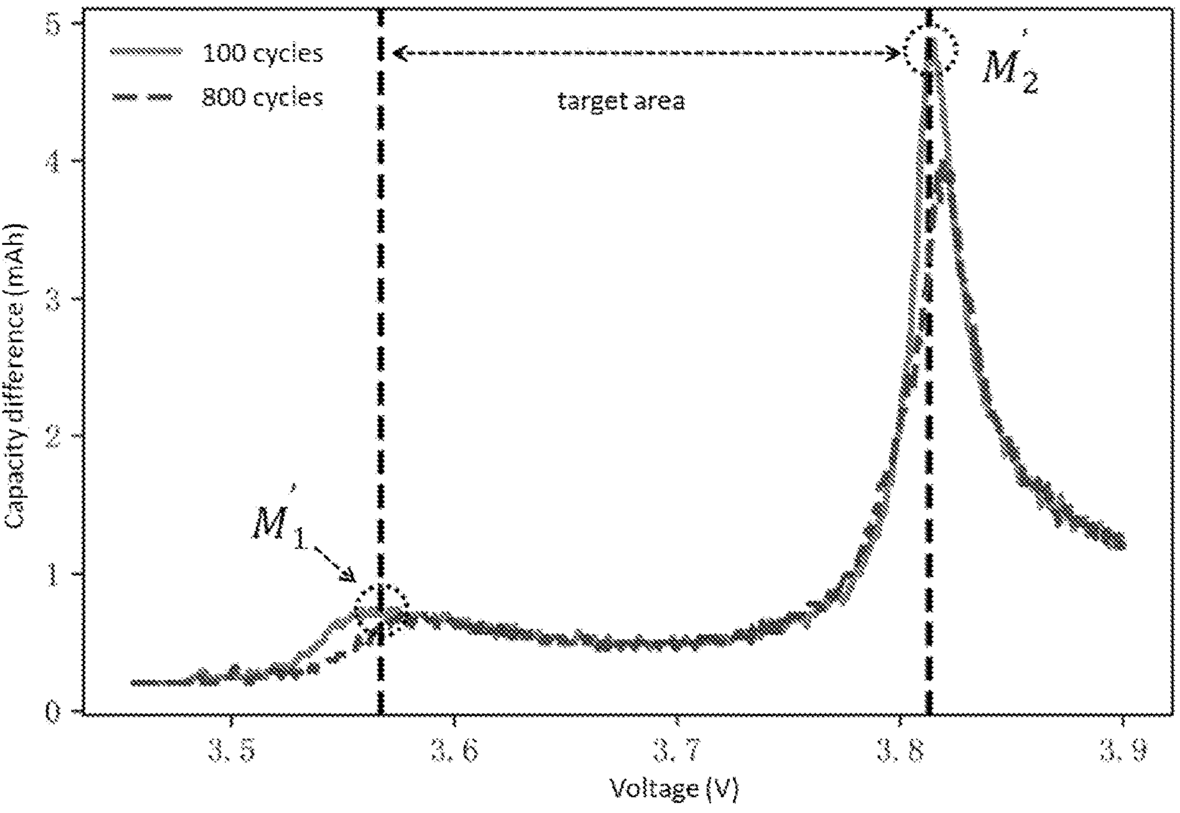
FIG. 3 shows a chart with capacity difference curves and a target area of the method for analyzing and predicting SOH of a lithium battery according to an embodiment of the present invention.

(3) Determining the target region. In this embodiment, the target area is determined based on a portion of data of the charging process at the $100_{th}$ cycle, and as shown in FIG. 3, the region between the adjacent M1' and M2' on the capacity difference curve of the $100_{th}$ cycle is selected as the target area. It can be seen that the voltage in the target area is in the range of 3.567~3.813 V. The cumulative capacity of the target area is further calculated. In another embodiment, the region between the adjacent M1' and M2' on the capacity difference curve of the $100_{th}$ cycle is first selected as the target area, and as the subsequent charging and discharging process of the battery continues, the target region can be replaced according to the capacity difference curve of the $800_{th}$ cycle. In other examples, the target area can be replaced or not replaced as the subsequent charging and discharging process of the battery continues, based on the $800_{th}$ cycle and other reasonable cycle numbers.

Figure 4:
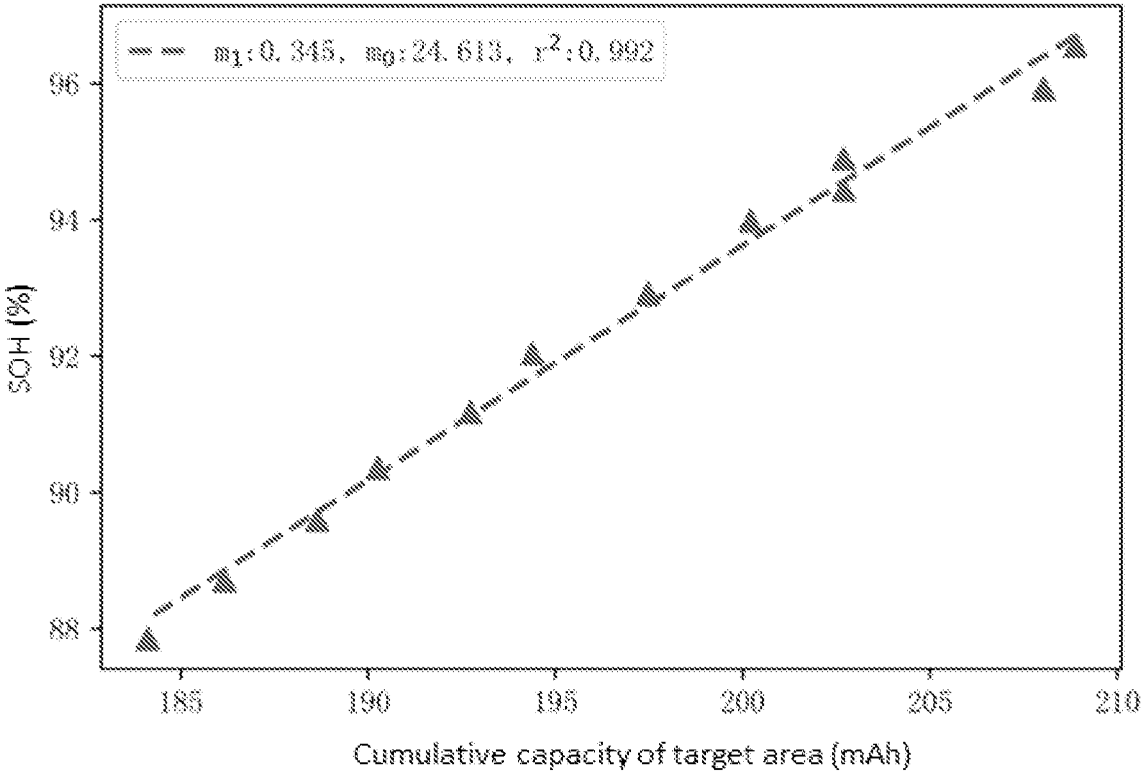
FIG. 4 shows a chart of the relationship between the cumulative capacity of the target area and the SOH of a lithium battery by applying the method for analyzing and predicting SOH of the lithium battery according to an embodiment of the present invention.

(4) Establishing the relationship between the cumulative capacity of the target area and the SOH. A calibration experiment is performed on the battery every 100 charge/discharge cycles, i.e., constant current and constant voltage charging until the battery is fully charged, and the ratio of the capacity of the battery at the end of charging to the rated capacity of the battery is taken as the actual SOH of the battery under the current cycle. At the same time, the cumulative capacity of the battery in the target area under the current cycle is calculated, and the relationship between the cumulative capacity of the target area $\Sigma Q_{diff}$ and SOH is established. Taking the previous 2000 charge cycle results as an example, the calculated SOH fitting results are shown in Table 1, and the fitted curve is shown in FIG. 4.

TABLE 1

Fitting results of Calculated SOH in the target area

| The number of cycles/cycle | Cumulative capacity of target area (mAh) | Actual SOH (%) | Calculated SOH (%) | Error (%) |
|---|---|---|---|---|
| 100 | 208.876 | 96.559 | 96.693 | 0.139 |
| 200 | 208.025 | 95.926 | 96.400 | 0.493 |
| 400 | 208.692 | 94.897 | 94.559 | 0.356 |
| 500 | 202.694 | 94.438 | 94.559 | 0.128 |
| 600 | 200.203 | 93.984 | 93.700 | 0.303 |
| 800 | 197.469 | 92.923 | 92.756 | 0.179 |
| 1000 | 194.380 | 92.035 | 91.690 | 0.375 |
| 1200 | 192.730 | 91.179 | 91.121 | 0.064 |
| 1400 | 190.259 | 90.361 | 90.268 | 0.103 |
| 1600 | 188.637 | 89.591 | 89.709 | 0.132 |
| 1800 | 186.162 | 88.711 | 88.854 | 0.162 |
| 2000 | 184.120 | 87.853 | 88.150 | 0.337 |

The fitting equation between the cumulative capacity of the target area $\Sigma Q_{diff}$ and the SOH is: SOH=0.345*$\Sigma Q_{diff}$+24.613 with a goodness-of-fitting/correlation coefficient $R^2$ of 0.992, which indicates that it is a good fitting result. The error is calculated as follows, i.e., $$\text{error} = \frac{\text{actual } SOH - \text{calculated } SOH}{\text{actual } SOH}.$$

It can be seen that the error is very small, which is basically within 0.5%.

Figure 5:
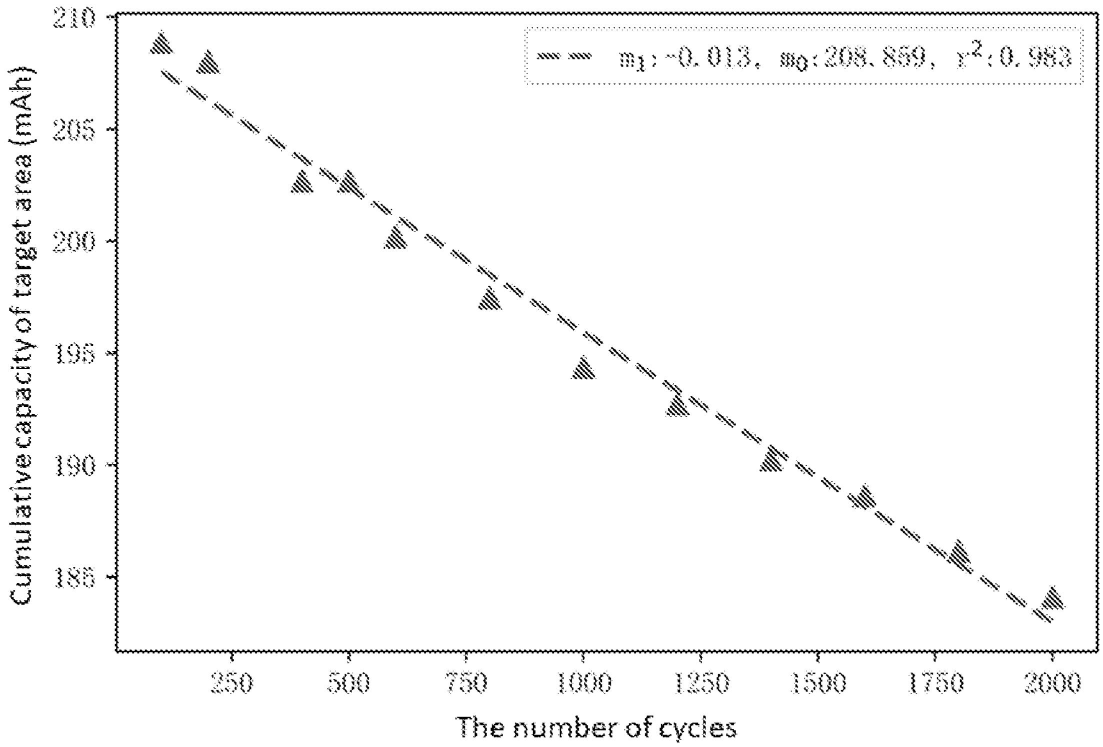
FIG. 5 shows a chart of the relationship between the number of cycles and the cumulative capacity of the target area of a lithium battery by applying the method for analyzing and predicting SOH of the lithium battery according to an embodiment of the present invention.
Figure 6:
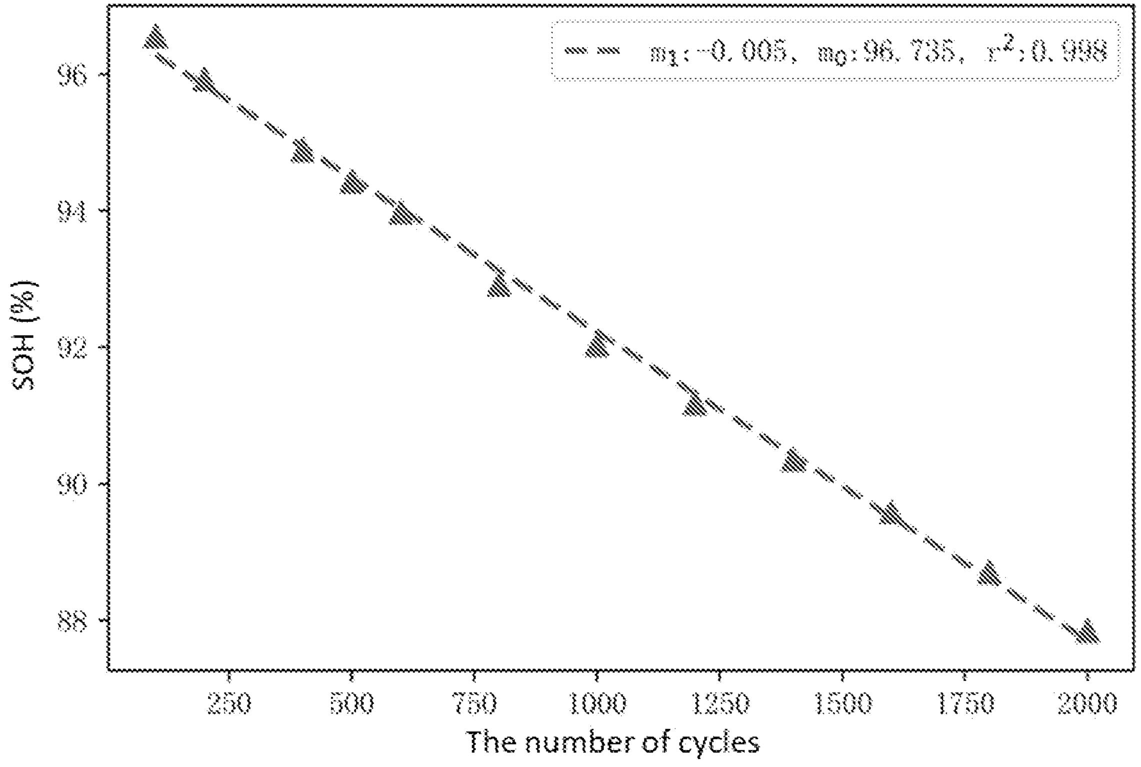
FIG. 6 shows a chart of the relationship between the number of cycles (that the battery can perform when the SOH reaches 80%) and the SOH of a lithium battery by applying the method for analyzing and predicting SOH of the lithium battery according to an embodiment of the present invention.

(5) Fitting the cumulative capacity of the battery in the target area with the number of cycles to establish the relationship between the number of cycles and the cumulative capacity of the target area. The relationship between the number of cycles (cycle) and the cumulative capacity of the target area is $\Sigma Q_{diff}$=−0.0129×cycle+208.859, and the goodness of fitting/correlation coefficient $R^2$ is 0.983, which indicates that the fitting result is good. The fitted curve is shown in FIG. 5.

In another embodiment, in the case of not knowing how many times the current battery has been cycled, the current cycle can be set as the base cycle, for example, the first cycle, and after that, the subsequent cycles are added up one by one. Therefore, the number of future cycles the battery can perform from now on can be determined. And because the fitting result is linear, the overall translation of the number of cycles (i.e., the x-axis) does not affect the conclusion.

In another embodiment, the battery will not be fully charged and discharged when the calculation is actually applied, so the number of cycles that the battery can perform when the SOH reaches 80% needs to be corrected. Specifically, the capacity $Q_{real}$ obtained from the last calibration experiment is taken as the actual full charge capacity of the battery for a subsequent period of time, the applied capacity of the current cycle of the battery during an actual application is $Q_{used}$, then the actual number of cycles carried out by the battery in the current state is:

$$\text{cycle}_{used} = \frac{Q_{used}}{Q_{real}},$$

where $\text{cycle}_{used} \leq 1$.

The discharge process of the current cycle also can be operated accordingly, so that the number of cycles that the battery can perform when the SOH reaches 80% can be corrected to obtain an accurate relationship between the number of cycles and the cumulative capacity of the target area.

(6) Establishing the relationship between the number of cycles and SOH. According to the relationship between the cumulative capacity of the target area and SOH, and the relationship between the number of cycles and the cumulative capacity of the target area, the relationship between the number of cycles and SOH can be obtained. The relationship between the number of cycles and SOH is SOH=−0.0045×cycle+96.735, and the calculated fitting curve is shown in FIG.

6.

(7) Predicting SOH. After calculating and fitting the SOH, the SOH can be predicted by combining the number of cycles and the cumulative capacity of the target area, and the number of cycles that the battery can perform when the SOH reaches 80% can be predicted. The prediction results are shown in Table 2. It can be seen that the prediction error of SOH is within 0.6%, therefore, the prediction results are highly accurate. It is found that if the SOH of the battery decreases to 80% in the future, the battery would have cycled to 3718 times, and the cumulative capacity of the target area would be 160.54 mAh.

TABLE 2

SOH prediction results for future cycles of lithium batteries

| The number of cycles/cycle | Cumulative capacity of target area (mAh) | Actual SOH (%) | Predicted SOH (%) | Error (%) |
|---|---|---|---|---|
| 2500 | 178.766 | 85.862 | 86.302 | 0.513 |
| 3000 | 173.831 | 84.115 | 84.599 | 0.576 |
| 3718 | 160.54 | / | 80.000 | / |

Figure 7:
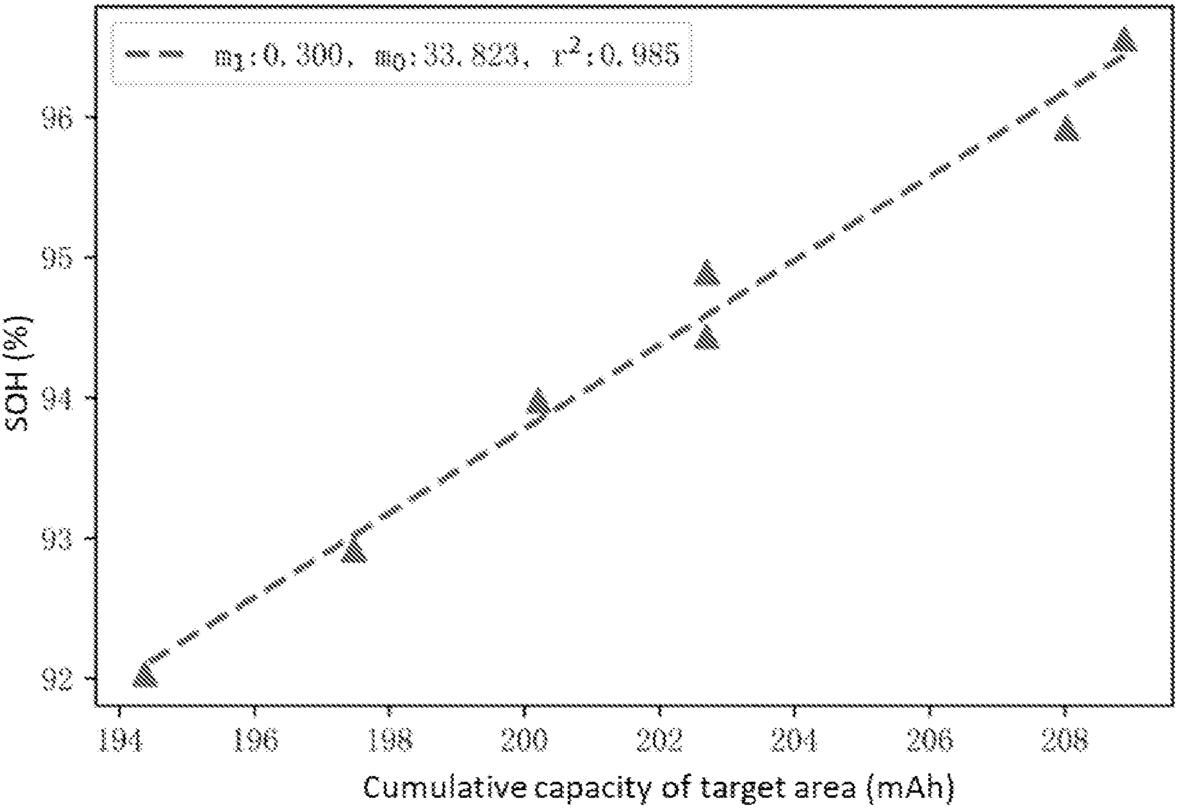
FIG. 7 shows a chart of the relationship between a cumulative capacity of a target area and the SOH of a lithium battery by applying the method for analyzing and predicting SOH of the lithium battery according to an embodiment of the present invention.

(8) In another embodiment, based on the partial charging data of the previous 1000 cycles, the cumulative capacity of the target area and the SOH are fitted to obtain the following fitting relationship: SOH=0.2998*$\Sigma Q_{diff}$+33.823, where the goodness of fitting is 0.985, which indicates that the calculated fitting result is good. The specific fitting curve is shown in FIG. 7. And the number of cycles and SOH (%) are also fitted. Based on the above results, the SOH of the future cycle of the lithium battery is predicted by calculation with the model, and the maximum error of the prediction result is 2.17%. The specific prediction results are shown in Table 3.

TABLE 3

SOH prediction results for future cycles of lithium batteries

| The number of cycles/cycle | Cumulative capacity of target area (mAh) | Actual SOH (%) | Predicted SOH(%) | Error (%) |
|---|---|---|---|---|
| 1400 | 190.259 | 90.361 | 90.863 | 0.56 |
| 2000 | 184.120 | 87.853 | 89.022 | 1.33 |
| 2500 | 178.766 | 85.862 | 87.417 | 1.81 |
| 3000 | 173.831 | 84.115 | 85.938 | 2.17 |
| 3398 | 154.026 | / | 80.000 | / |

(9) In another embodiment, when predicting the SOH, the future SOH is predicted based on the currently existing data, and the future SOH is predicted again after a period of time based on the new data, which indicates that the original prediction result is updated. Therefore, with the use of the battery, more and more data are available, and the final prediction result of SOH is more and more accurate.

Figure 8:
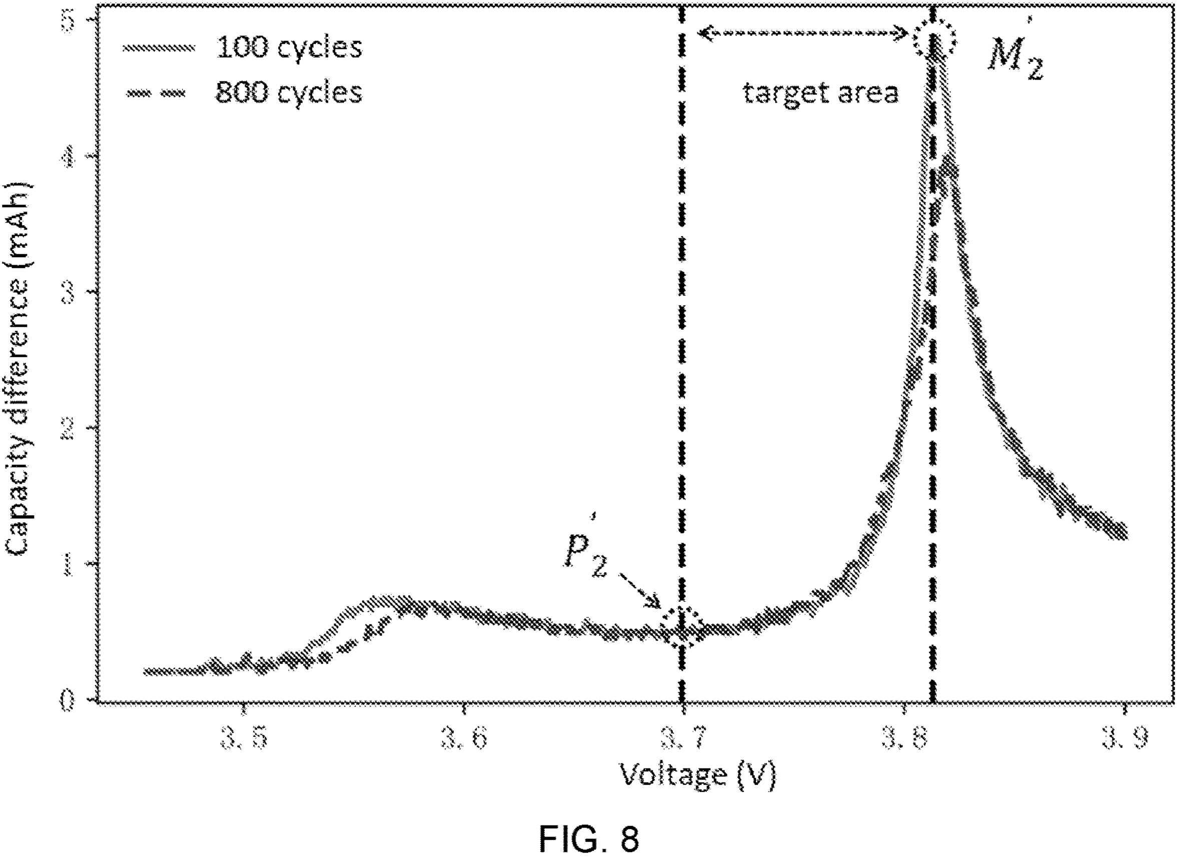
FIG. 8 shows a chart of the capacity difference versus voltage curve and a target area of a lithium battery by applying the method for analyzing and predicting SOH of the lithium battery according to another embodiment of the present invention.

(10) In another embodiment, the target area is replaced according to the definition of the target area for calculation, and the region between the adjacent difference abrupt change point P2' and difference maximum point M2' on the capacity difference curve of the $100_{th}$ circle is selected as the target area, which is shown as FIG. 8. It can be seen that the voltage of the target area is in a range of 3.699~3.813V. The cumulative capacity of the target area is further calculated.

Figure 9:
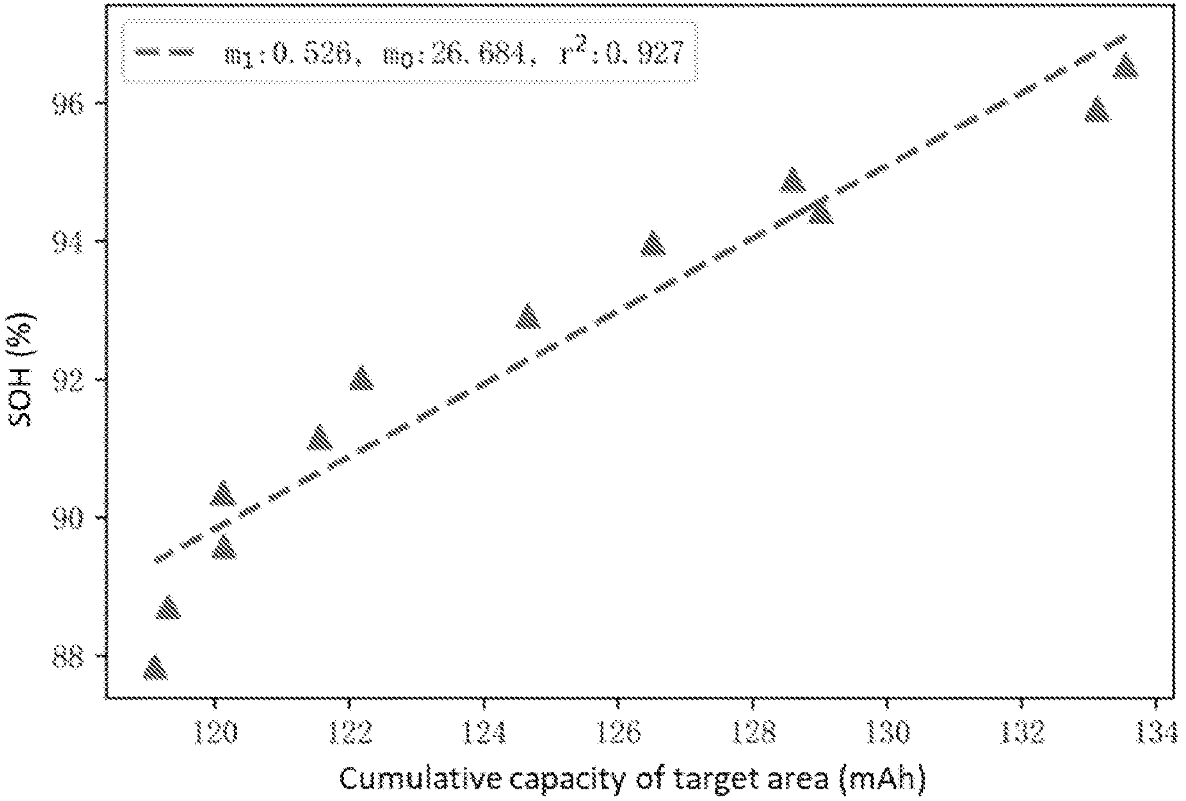
FIG. 9 shows a chart of the relationship between the cumulative capacity of target area and the SOH of the lithium battery by applying the method for analyzing and predicting SOH of the lithium battery in FIG. 7 according to an embodiment of the present invention.

Based on the partial charging data of the previous 2000 cycles, the cumulative capacity of the target area and the SOH are fitted to obtain the following fitting relationship SOH=0.526*$\Sigma Q_{diff}$+26.684, where the goodness of fitting is 0.927, which indicates that the fitting result is good. The fitting results of SOH are shown in Table 4 and the specific fitting curve is shown in FIG. 9.

TABLE 4

Fitting results of SOH of the target area

| The number of cycles/cycle | Cumulative capacity of target area (mAh) | Calculated SOH (%) | Actual SOH (%) | Error (%) |
|---|---|---|---|---|
| 100 | 133.540 | 96.961 | 96.559 | 0.416 |
| 200 | 133.117 | 96.738 | 95.926 | 0.846 |
| 400 | 128.591 | 94.356 | 94.897 | 0.570 |
| 500 | 129.005 | 94.574 | 94.438 | 0.143 |
| 600 | 126.518 | 93.265 | 93.984 | 0.765 |
| 800 | 124.652 | 92.283 | 92.923 | 0.689 |
| 1000 | 122.181 | 90.982 | 92.035 | 1.144 |
| 1200 | 121.562 | 90.657 | 91.179 | 0.573 |
| 1400 | 120.121 | 89.898 | 90.361 | 0.512 |
| 1600 | 120.135 | 89.906 | 89.591 | 0.352 |
| 1800 | 119.308 | 89.471 | 88.711 | 0.856 |
| 2000 | 119.112 | 89.368 | 87.853 | 1.724 |

The relationship between the number of cycles and the SOH is further established. Based on the above results, the SOH of the lithium battery is predicted for future cycles, and the prediction results show that when the cycle reaches 3881, the SOH of the battery at this time is 80%.

(11) In another embodiment, the prediction of SOH is not only based on the charging data, but also combined with the discharging data. Therefore, the prediction results only based on discharge or charging are corrected to make the prediction results more accurate than those relying solely on the charging data.

The protection scope of the method for analyzing and predicting state of health of lithium battery described in the embodiments of the present invention is not limited to the execution sequence of the steps listed in the present invention. All schemes realized by adding, subtracting, and replacing steps in the prior art according to the principles of the present invention are included in the protection scope of the present invention.

Embodiments of the present invention also provide an apparatus for analyzing and predicting SOH of lithium battery, where the apparatus for analyzing and predicting SOH of lithium battery can realize the method for analyzing and predicting SOH of lithium battery described in the present invention. The apparatus for analyzing and predicting SOH of lithium battery described in the present invention includes, but is not limited to, the structure of the apparatus for analyzing and predicting SOH of lithium battery as enumerated in the embodiments, and all structural deformations and substitutions of the prior art made according to principles of the present invention are included in the protection scope of the present invention.

Figure 10:
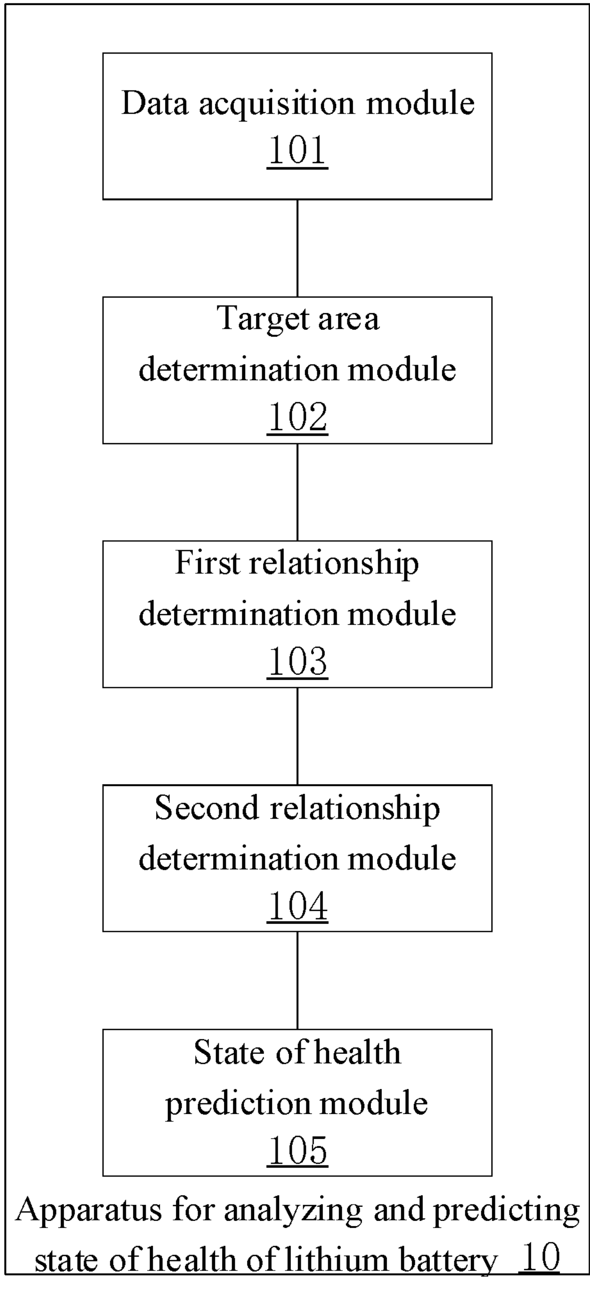
FIG. 10 shows a schematic block diagram of an apparatus for analyzing and predicting SOH of a lithium battery according to an embodiment of the present invention.

As shown in FIG. 10, the apparatus for analyzing and predicting SOH of lithium battery 10 provided in this embodiment includes a data acquisition module 101, a target area determination module 102, a first relationship determination module 103, a second relationship determination module 104, and a state of health prediction module 105.

The data acquisition module 101 is configured to collect battery data in accordance with a preset time interval, where the battery data at least includes battery operating time, current, and voltage.

Specifically, the data acquisition module 101 collects the battery data of the electric vehicle or power plant at regular intervals, the collected data mainly includes battery operating time, current, and voltage, and state of charge (SOC) and temperature can also be collected according to the required data needs.

The target area determination module 102 is configured to determine a target area based on the battery data.

Specifically, the target area determination module 102 performs the following steps.

(1) Calculating a capacity difference according to a corresponding relationship between the voltage and capacity, and fitting the voltage and the capacity difference to obtain a relationship curve between the voltage and the capacity difference, smoothing the curve, and selecting the capacity difference abrupt change point (the starting point of a sudden sharp change of the capacity difference) and the capacity difference maximum point (the point in a certain region where the capacity difference is the largest).

(2) Determining the target area based on a particular charging or discharging cycle activity of the battery, where the target area is a region containing a significant change in capacity difference. The starting point of the target area may be a capacity difference abrupt change point or a capacity difference maximum point, and the ending point of the target area is a capacity difference maximum point. Once the target area is determined based on data from a single charge/discharge cycle, it is not changed thereafter.

(3) Calculating the cumulative capacity value of the target area $\Sigma Q_{diff}$, i.e. calculating the charged or discharged capacity when the battery is charged or discharged from the starting point to the end point of the target area.

The first relationship determination module 103 is configured to establish the relationship between the cumulative capacity of the target area and the state of health (SOH) of the battery.

Specifically, after a certain period of usage, such as every 100 or 200 cycles, or every 15 days, a calibration experiment is performed on the battery under a particular cycle, that is, in actual scenarios, to calibrate the state of charge (SOC) of battery management system (BMS), a full charge and discharge calibration experiment is conducted on the battery periodically, therefore, the present invention does not require additional testing work. The battery in its current state (i.e., under a particular cycle) is subjected to constant current and constant voltage discharging until fully discharged, and then constant current and constant voltage charging until fully charged, or when reversed the battery is subjected to constant current and constant voltage charging until fully charged, and then constant current and constant voltage discharging until fully discharged, as the calibration experiment conditions are the same for different cycles. The accumulated capacity at the end of charging or discharging is used as the actual available capacity $Q_{real}$ for the current cycle. The ratio of this accumulated capacity to the rated capacity $Q_{rated}$ of the battery is SOH, that is $$SOH = \frac{Q_{real}}{Q_{rated}}.$$

The relationship between the cumulative capacity of the target area and SOH of the battery is further established, and SOH of battery can be predicted based on the cumulative capacity value of the target area by using this relationship. The fitting equation is:

$$SOH = \sum_{n=1}^{n_{max}} m_n \times \left(\sum Q_{diff}\right)^n + m_0,$$

where n is the order of the polynomial series, $m_n$ is the coefficient of the $n_{th}$ order of the polynomial series, $m_0$ is the fitted intercept, and $n_{max}$ is the highest order of the polynomial series.

The second relationship determination module 104 is configured to correlate the number of cycles in the current state of the battery with the state of health of the battery using the cumulative capacity of the target area, to determine the relationship between the number of cycles and the state of health of the battery.

Specifically, if the number of cycles in the current state of the lithium battery is known (or the number of cycles in the current state is unknown, but the relationship between the number of cycles and the SOH needs to be determined, then the cycle in the current state is set as the base cycle (such as the first cycle), and the subsequent cycles are added up one by one), the data of the battery under different charge and discharge cycles is used for determining the target area and calculating the cumulative capacity of the battery of the target area during different cycles according to step 2). The number of battery cycles (cycle) and the cumulative capacity $\Sigma Q_{diff}$ are fitted to establish the relationship between the number of cycles and the cumulative capacity of the target area, and the cumulative capacity value of the target area of the battery during a specific cycle in the future can be predicted using this relationship. The fitting equation is as follows:

$$\sum Q_{diff} = \sum_{n=1}^{n_{max}} m_n \times \text{cycle}^n + m_0,$$

where n is the order of the polynomial series, $m_n$ is the coefficient of the $n_{th}$ order of the polynomial series, $m_0$ is the fitted intercept, and $n_{max}$ is the highest order of the polynomial series.

Furthermore, according to the equations $$SOH = \sum_{n=1}^{n_{max}} m_n \times \left(\sum Q_{diff}\right)^n + m_0 \text{ and}$$

$$\sum Q_{diff} = \sum_{n=1}^{n_{max}} m_n \times \text{cycle}^n + m_0,$$

the relationship between the number of battery cycles (cycle) and the SOH can be established. This relationship can be used to predict the SOH of the battery in a specific cycle in the future, and to predict how many charge and discharge cycles the battery can perform when the SOH reaches 80%.

The state of health prediction module 105 is configured to predict the state of health of the battery in the future according to the relationship between the number of cycles and the state of health.

In the several embodiments provided in the present invention, it should be understood that the apparatus or method disclosed may be realized in other ways. For example, the embodiments of the apparatus described above are merely illustrative, e.g., the division of modules/units is merely a logical function division, and in practice, there may be other divisions, e.g., a plurality of modules or units may be combined or may be integrated into another system, or some features may be omitted or not performed. In another aspect, the mutual coupling, direct coupling, or communication connection shown or discussed may be indirect coupling or communication connection through some interface, device, module, or unit, and may be electrical connection, mechanical connection, or otherwise.

The modules/units illustrated as separated components may or may not be physically separated, and the components shown as modules/units may or may not be physical modules, i.e., they may be located in a single place or may also be distributed over a plurality of network units. Some or all of these modules/units may be selected according to actual needs to realize the purpose of the embodiments of the present invention. For example, the various functional modules/units in various embodiments of the present invention may be integrated into a single processing module, or each module/unit may physically exist separately, or two or more modules/units may be integrated into a single module/unit.

Those of ordinary skill in the art should further appreciate that the units and algorithm steps of each example described in the embodiments disclosed herein can be implemented in electronic hardware, computer software, or a combination of both. And in order to clearly illustrate the interchangeability of hardware and software, the components and steps of each example have been generally described in terms of function in the above description. Whether these functions are implemented in hardware or software depends on the particular application and design constraints of the technical solution. Skilled artisans may implement the described functionality in varying ways for each particular application, but such implementations should not be considered to be outside the scope of the present invention.

Figure 11:
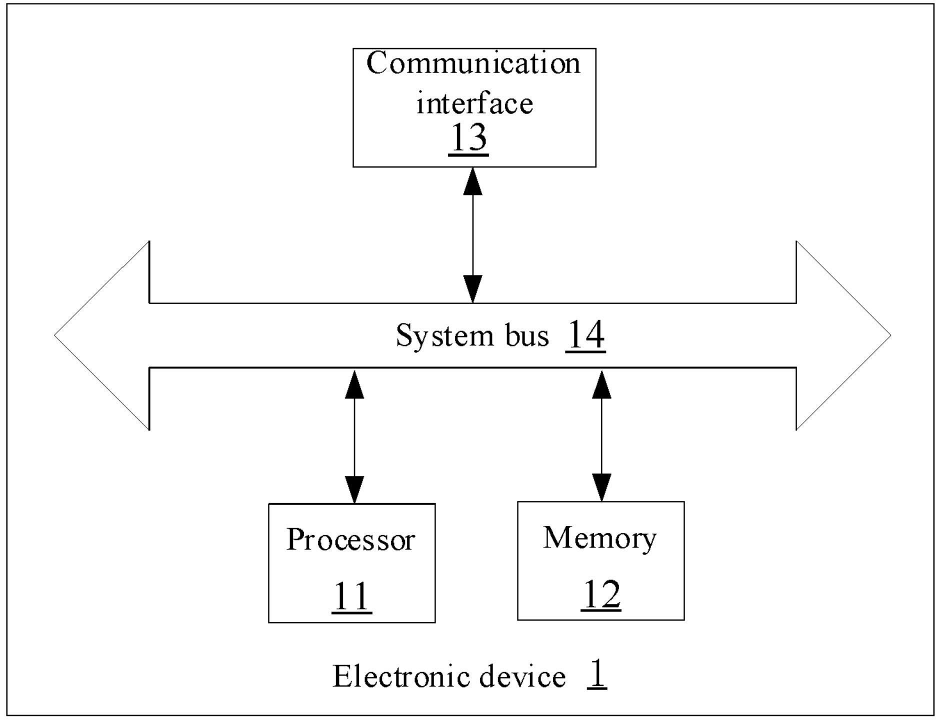
FIG. 11 is a schematic block diagram showing a connection structure of an electronic device according to an embodiment of the present invention.

As shown in FIG. 11, an electronic device 1 of the present invention includes a processor 11, a memory 12, a communication interface 13, or/and a system bus 14. The memory 12 and the communication interface 13 are connected to the processor 11 and communicate with each other via the system bus 14, the memory 12 is configured to store computer programs, the communication interface 13 is configured to communicate with other devices, and the processor 11 is configured to run the computer programs so that the electronic device 1 performs the steps of the method described above.

The processor 11 may be a general processor including a central processing unit (CPU), a network processor (NP), etc., a digital signal processing (DSP) device, an application-specific integrated circuit (ASIC), a field programmable gate array (FPGA), or other programmable logic devices, discrete gates or transistor logic devices, and discrete hardware components.

The memory 12 may include a random access memory (RAM) or a non-volatile memory, such as at least one disk storage apparatus.

The system bus 14 may be a peripheral component interconnect (PCI) bus, an extended industry standard architecture (EISA) bus, etc. The system bus 14 includes an address bus, a data bus, a control bus, etc. The communication interface 13 is configured to realize the communication between the database access device and other devices (such as a client, a read-write library, and a read-only library).

The electronic device includes but is not limited to personal computers such as desktop computers, laptops, tablets, smart phones, and personal digital assistants (PDAs). In other embodiments, the hardware device may be a server arranged on one or more entity servers according to various factors such as functions and loads, or may be a cloud server formed by distributed or centralized server clusters, which is not limited herein in this embodiment.

The present invention further provides a computer-readable storage medium. One of ordinary skill in the art can understand that all or part of the steps in the method of the above embodiments can be completed by instructing the processor through a program, and the program may be stored in a computer-readable storage medium. The storage medium may be a non-transitory medium, such as random access memory, a read only memory, a flash memory, a hard disk, a solid state drive, a magnetic tape, a floppy disk, an optical disc, or any combination thereof. The storage medium described above may be any available medium that can be accessed by a computer or a data storage device such as a server or a data center that integrates one or more available media. The available medium may be a magnetic medium (e.g., floppy disk, hard disk, magnetic tape), an optical medium (e.g., digital video disc (DVD)), or a semiconductor medium (e.g., solid state disk (SSD)), etc.

The description of the flow or structure corresponding to each of the above drawings has its emphasis. For parts of a certain flow or structure that are not described in detail, please refer to the relevant descriptions of other flows or structures.

The above embodiments are merely illustrative of the principles and effects of the present invention, and are not intended to limit the present invention. Any person skilled in the art may modify or change the above embodiments without violating the spirit and scope of the present invention. Therefore, all equivalent modifications or changes made by persons having ordinary knowledge of the art without departing from the spirit and technical ideas disclosed in the present invention shall be covered by the claims of the present invention.

The invention claimed is:

1. A method for analyzing and predicting state of health of a lithium battery, comprising:

collecting battery data in accordance within a predetermined time interval from lithium battery in a new energy electric vehicle or an energy storage power plant through a battery management system, wherein the battery data comprises at least battery operating time, current, and voltage;

determining a target area based on the battery data, comprising:

calculating a capacity difference according to a minimum voltage variation unit based on a relationship between voltage and capacity;

fitting a relationship between the voltage and the capacity difference;

determining, based on the relationship between the voltage and the capacity difference, a capacity difference abrupt change point, a capacity difference maximum point, and a maximum point in a curve of the capacity difference versus the voltage;

determining the target area based on a particular charging or discharging cycle activity of the lithium battery; and defining the target area as a region of the curve of the capacity difference versus the voltage, wherein a starting point of the target area is defined at a capacity difference abrupt change point or a capacity difference maximum point, and an ending point of the target area is defined at the maximum point of the curve of the capacity difference versus the voltage; wherein the capacity difference abrupt change point is a point at which a capacity difference value is substantially the same as an average capacity difference of a preceding section and an average capacity difference of a subsequent section is greater than the capacity difference value at that point;

establishing a relationship between a cumulative capacity of the target area and the state of health of the lithium battery; wherein the cumulative capacity is an incremental value of the capacity from the starting point to the end point of the target area, and is calculated as a sum of capacity differences from the starting point to the end point of the target area;

correlating a number of cycles in the state of health of the lithium battery at current time with the state of health of the lithium battery using the cumulative capacity of the target area, to determine a relationship between the number of cycles and the state of health of the lithium battery; and predicting the state of health of the lithium battery in the future according to the relationship between the number of cycles and the state of health of the lithium battery.

2. The method according to claim 1, wherein the battery data further comprises a state of charge on the lithium battery;

wherein the capacity is determined based on the state of charge; or the capacity is obtained by calculating a capacity change in a charging and discharging process according to the collected current and the battery operating time.

3. The method according to claim 1, wherein a way of determining the number of cycles comprises:

taking the current cycle as a base cycle and adding subsequent cycles one by one, so that subsequent number of cycles is a constant rolling of the current number of cycles; and correcting the number of cycles by applying the capacity obtained from a last calibration experiment as a full charge capacity for a subsequent period of time, and by utilizing an actual charge capacity during a current cycle of the lithium battery.

4. The method according to claim 1, wherein the battery data further comprises charging data and/or discharging data; and wherein the method further comprises at least one of the following:

calculating the number of cycles that can be performed by the lithium battery when the state of health of the lithium battery reaches a predetermined percentage based on a first relationship between the number of cycles and the state of health of the lithium battery;

fitting the cumulative capacity of the target area and the state of health of the lithium battery based on the charging data in a preset number of cycles, and making a first prediction of a future state of health of the lithium battery based on a second relationship between the number of cycles and the state of health of the lithium battery;

making a second prediction of the future state of health of the lithium battery and updating result of the first prediction based on new battery data acquired after a predetermined period of time;

replacing the target area at a specific cycle number from a difference abrupt change point to a difference maximum point of a capacity difference curve; and making a third prediction of the future state of health of the lithium battery by combining the charging data and the discharging data, and correcting prediction results corresponding to the charging data and the discharging data.

5. An electronic device, comprising: a processor and a non-transitory memory; wherein the memory is configured to store a computer program; and wherein the processor is configured to execute the computer program stored in the memory to enable the electronic device to perform the method according to claim 1.

6. A non-transitory computer-readable storage medium, having a computer program stored thereon, wherein the computer program, when executed by a processor, implements the method according to claim 1.

7. The method according to claim 1, wherein an equation for calculating the capacity difference according to the minimum voltage variation unit is as follows:

$$Q_{diff}^{k} = Q_{k}^{u} - Q_{k-1}^{u};$$

wherein $$Q_{diff}^{k}$$

is the capacity difference corresponding to a $k_{th}$ voltage change based on the minimum voltage variation unit u, and $$Q_{k}^{u}$$

is a cumulative capacity at a $k_{th}$ sampling; when k is 1, the $$Q_{k}^{u}$$

is the cumulative capacity at a first sampling.

8. The method according to claim 1, wherein fitting the relationship between the voltage and the capacity difference comprises generating a capacity difference versus voltage curve.

9. An apparatus for analyzing and predicting state of health of a lithium battery, comprising:

a data acquisition module, configured to collect battery data in within a predetermined time interval from lithium battery in a new energy electric vehicle or an energy storage power plant through a battery management system, wherein the battery data comprises parameters including at least battery operating time, current, and voltage;

a target area determination module, configured to determine a target area for predicting the state of health of the lithium battery based on the battery data; wherein the target area determination module is further configured to:

calculate a capacity difference according to a minimum voltage variation unit based on a relationship between voltage and capacity;

fit a relationship between the voltage and the capacity difference;

determine, based on the relationship between the voltage and the capacity difference, a capacity difference abrupt change point, a capacity difference maximum point, and a maximum point in a curve of the capacity difference versus the voltage;

determine the target area based on a particular charging or discharging cycle activity of the lithium battery; and define the target area as a region of the curve of the capacity difference versus the voltage, wherein a starting point of the target area is defined at a capacity difference abrupt change point or a capacity difference maximum point, and an ending point of the target area is defined at the maximum point of the curve of the capacity difference versus the voltage; wherein the capacity difference abrupt change point is a point at which a capacity difference value is substantially the same as an average capacity difference of a preceding section and an average capacity difference of a subsequent section is greater than the capacity difference value at that point;

a first relationship determination module, configured to establish a relationship between a cumulative capacity of the target area and the state of health of the lithium battery; wherein the cumulative capacity is an incremental value of the capacity from the starting point to the end point of the target area, and is calculated as a sum of capacity differences from the starting point to the end point of the target area;

a second relationship determination module, configured to correlate a number of cycles in a current state of the lithium battery with the state of health of the lithium battery using the cumulative capacity of the target area, and to determine a relationship between the number of cycles and the state of health of the lithium battery; and a state of health prediction module, configured to predict the state of health of the lithium battery in a future according to the relationship between the number of cycles and the state of health.

* * * * *